(12) United States Patent
Su et al.

(10) Patent No.: US 9,578,747 B2
(45) Date of Patent: Feb. 21, 2017

(54) STRUCTURE OF VIA HOLE OF ELECTRICAL CIRCUIT BOARD

(71) Applicant: ADVANCED FLEXIBLE CIRCUITS CO., LTD., Taoyuan County (TW)

(72) Inventors: Kuo-Fu Su, Taoyuan County (TW); Gwun-Jin Lin, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 59 days.

(21) Appl. No.: 14/827,668

(22) Filed: Aug. 17, 2015

(65) Prior Publication Data

US 2015/0359097 A1    Dec. 10, 2015

Related U.S. Application Data

(60) Division of application No. 14/307,652, filed on Jun. 18, 2014, now Pat. No. 9,204,561, which is a continuation-in-part of application No. 13/548,345, filed on Jul. 13, 2012, now abandoned.

(51) Int. Cl.
| | |
|---|---|
| *H05K 1/11* | (2006.01) |
| *H05K 1/00* | (2006.01) |
| *H05K 1/02* | (2006.01) |
| *H05K 3/00* | (2006.01) |
| *H05K 3/42* | (2006.01) |

(52) U.S. Cl.
CPC ............... *H05K 1/115* (2013.01); *H05K 1/028* (2013.01); *H05K 1/0298* (2013.01); *H05K 3/002* (2013.01); *H05K 3/426* (2013.01); *Y10T 29/49165* (2015.01)

(58) Field of Classification Search
CPC ...... H05K 1/115; H05K 1/028; H05K 1/0298; H05K 3/002; H05K 3/426; Y10T 29/49165
USPC ................................ 174/254, 259, 262–266
See application file for complete search history.

(56) References Cited

U.S. PATENT DOCUMENTS

| | | | | |
|---|---|---|---|---|
| 5,004,639 | A  * | 4/1991 | Desai ........................ | B32B 7/02 174/254 |
| 6,293,008 | B1 * | 9/2001 | Schmidt ................. | H05K 1/028 156/268 |
| 6,483,037 | B1 * | 11/2002 | Moore ................. | H05K 1/0278 174/254 |
| 6,713,682 | B1 * | 3/2004 | Hirahara ................ | H05K 1/116 174/254 |
| 2007/0153488 | A1 * | 7/2007 | Yang ...................... | H05K 3/182 361/748 |

(Continued)

*Primary Examiner* — Sherman Ng
(74) *Attorney, Agent, or Firm* — Rosenberg, Klein & Lee (57) ABSTRACT

A structure of via hole of electrical circuit board includes an adhesive layer and a conductor layer that are formed after wiring is formed on a carrier board. At least one through hole extends in a vertical direction through the carrier board, the wiring, the adhesive layer, and the conductor layer and forms a hole wall surface. The conductor layer shows a height difference with respect to an exposed zone of the circuit trace in the vertical direction. A conductive cover section covers the conductor layer and the hole wall surface of the through hole. The carrier board is a single-sided board, a double-sided board, a multi-layered board, or a combination thereof, and the single-sided board, the double-sided board, and multi-layered board can be flexible boards, rigid boards, or composite boards combining flexible and rigid boards.

1 Claim, 9 Drawing Sheets

(56) References Cited

U.S. PATENT DOCUMENTS

2008/0257597 A1* 10/2008 Ohsumi ................ H05K 3/427
  174/266
2011/0005811 A1* 1/2011 Yamato ................ H05K 3/4635
  174/254

* cited by examiner

STRUCTURE OF VIA HOLE OF ELECTRICAL CIRCUIT BOARD

CROSS-REFERENCES TO RELATED APPLICATIONS

This application is a division of Ser. No. 14/307,652 filed Jun. 18, 2014, currently pending, which is a continuation-in-part of Ser. No. 13/548,345 filed on Jul. 13, 2012, now abandoned.

BACKGROUND OF THE INVENTION

1. Field of the Invention

The present invention relates to the field of via hole of electrical circuit board, and in particular to a structure of via hole of electrical circuit board and a manufacturing method thereof.

2. The Related Arts

A printed circuit board (PCB) is a vital electronic component and is also a support for electronic devices and parts, serving as a provider of connection of wiring of electronic parts. A conventional circuit board applies a process of printing etching resist to make wiring and patterns of circuit and is thus referred to as a printed circuit board or a printed wiring board. Since electronic products are getting smaller and more elaborate, most of the modern-day circuit boards are made by means of attaching resist (laminating or coating), and are then subjected to exposure and development, followed by etching to complete the manufacture of a circuit board.

A process conventionally adopted to make a via hole in a circuit board is to first provide a carrier board having upper and lower copper foil layers and adhesive layers. A drilling operation is then performed and a conductive cover portion is electroplated. Afterwards, the carrier board is subjected to coating of dry film, exposure, development, and etching to form a plurality of etched areas. Finally, laminating is applied to the etched carried board.

However, the conventional process of making via hole in circuit board is a process that first performs drilling and electroplating and etching is thereafter performed. The flow of operation is simple, but often suffers the following shortcomings (1) The thickness of the carrier board become inhomogeneous and this leads to poor yield rate of fine wiring process. (2) Impurity may be generated in the process of electroplating and this leads to reduced yield rate of image transfer and etching operation. (3) Size stability of the carrier board deteriorates and this leads to imprecise alignment for exposure. (4) The structure of the carrier is changed and this easily leads to poor flexibility. Consequently, further improvement can be made on the known process of making structure of via hole in circuit board.

SUMMARY OF THE INVENTION

In view of the above, the primary object of the present invention is to provide a structure of via hole of electrical circuit board and a manufacturing method thereof.

A via hole structure adopted by the present invention to handle the technical issue of the prior art techniques is that a circuit trace is first formed on a carrier board and an adhesive layer and a conductor layer are subsequently formed. At least one through hole extends in a vertical direction through the carrier board, the circuit trace, the adhesive layer, and the conductor layer, and forms a hole wall surface. The conductor layer shows a height difference with respect to an exposed zone of the circuit trace in the vertical direction. A conductive cover section covers the conductor layer and the hole wall surface of the through hole. The carrier board can be a single-sided board, a double-sided board, a multi-layered board, or a combination thereof, and the single-sided board, the double-sided board, and multi-layered board can be circuit boards of different properties, such as flexible boards, rigid boards, or composite boards combining flexible and rigid boards.

Compared with the conventional manufacture process of via hole of electrical circuit board, the present invention has the following advantages. (1) Due to etching being directly applied to the raw material, the yield rate is greatly improved. (2) No impurity issue occurs in the manufacture process. (3) The material used has excellent stability. (4) Except structural variation at hole plating zones, the material of the substrate is not subjected to significant change. (5) The density of circuit traces on the substrate can be increased.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
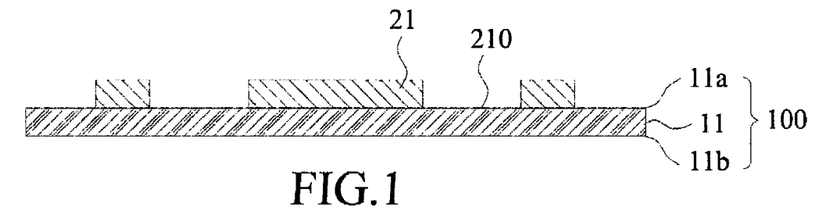
FIG. 1 is a cross-sectional view showing a carrier board is manufactured in the first embodiment of the present invention.

With reference to the drawings and in particular to FIGS. 1-6, which are cross-sectional views showing a structure of via hole of electrical circuit board according to a first embodiment of the present invention at different steps of manufacture process As shown in FIG. 1, a carrier board 100 is manufactured first. In the first embodiment of the present invention, the carrier board 100 is a flexible circuit board, which comprises a first substrate 11. The first substrate 11 has a first substrate upper surface 11a and a first substrate lower surface 11b. The first substrate upper surface 11a forms at least one upper circuit trace 21. The upper circuit traces 21 are spaced by spacing zones 210.

Figure 2:
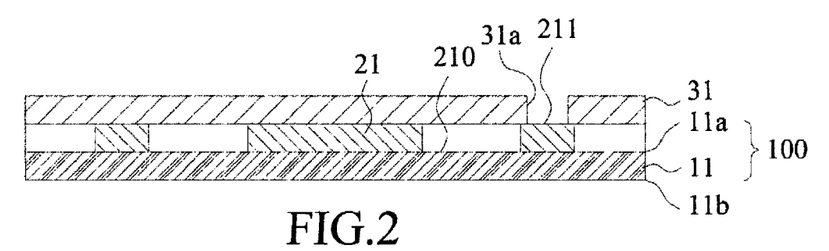
FIG. 2 is a cross-sectional view showing an upper adhesive layer is formed on the carrier board of FIG. 1.

After the manufacture of the carrier board 100, an upper adhesive layer 31 is formed on a surface of the upper circuit trace 21 (as shown in FIG. 2). The upper adhesive layer 31 may completely cover the surface of the upper circuit trace 21 or locally covers partial areas of the upper circuit trace 21. A portion of the upper circuit trace 21 that is not covered by the upper adhesive layer 31 is defined as an upper circuit trace exposed zone 211, serving as exposed contact for a surface-mounted device (SMD) or finger pad conductive contacts.

Figure 2A:
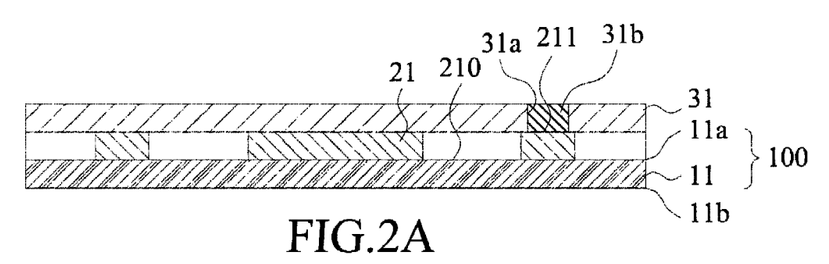
FIG. 2A is a cross-sectional view showing an etching resisting layer is filled in an adhesive layer opening zone of FIG. 2.

As shown in FIGS. 2 and 2A, the upper adhesive layer 31 of the present invention is formed, in advance, with an upper adhesive layer opening zone 31a corresponding to the upper circuit trace exposed zone 211 and an etching resisting layer 31b is filled in the upper adhesive layer opening zone 31a. The etching resisting layer 31b can be made of an acid resistant material or an alkali resistant material in order to protect the upper circuit trace exposed zone 211 from being etched in a subsequent etching process.

Figure 3:
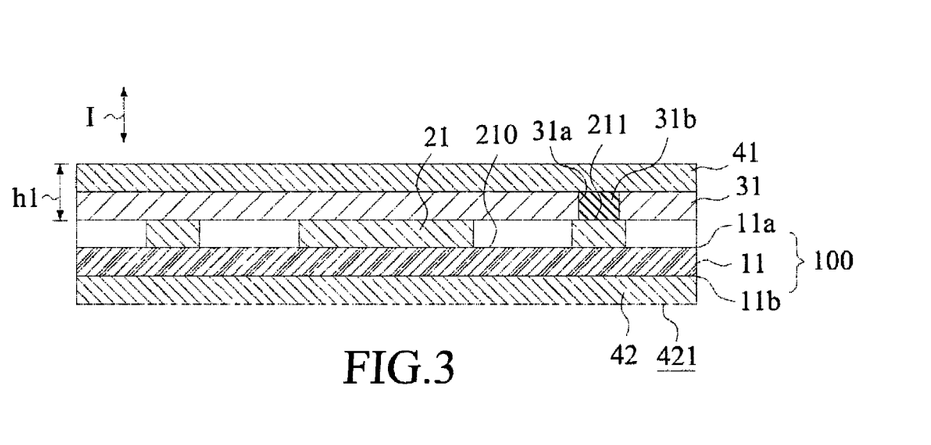
FIG. 3 is a cross-sectional view showing an upper conductor layer is formed on the upper adhesive layer and the etching resisting layer, and a lower conductor layer is formed on a bottom surface of the first substrate of FIG. 2A.

An upper conductor layer 41 is formed on the upper adhesive layer 31 and the etching resisting layer 31b. The upper conductor layer 41 shows a first height difference h1 (as shown in FIG. 3) with respect to the upper circuit trace exposed zone 211 of the upper circuit trace 21 in a vertical direction I. A lower conductor layer 42 is formed on the first substrate lower surface 11b of the first substrate 11. The lower conductor layer 42 has a lower conductor layer bottom surface 421.

Figure 4:
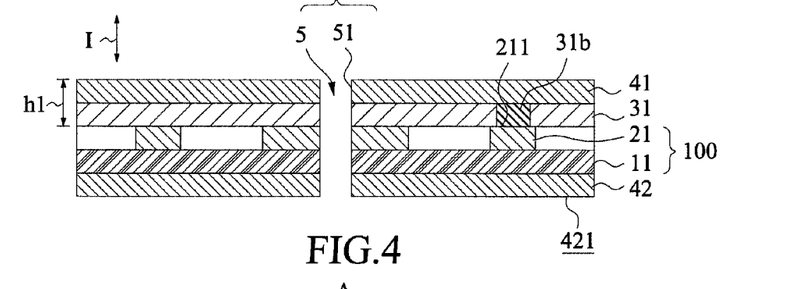
FIG. 4 is a cross-sectional view showing a through hole is extended through the upper conductor layer, the upper adhesive layer, the upper circuit trace, the first substrate, and the lower conductor layer of FIG. 3.

As shown in FIG. 4, at least one through hole 5 extends in the vertical direction I through the upper conductor layer 41, the upper adhesive layer 31, the upper circuit trace 21, the first substrate 11, and the lower conductor layer 42 and forms a hole wall surface 51. The through hole 5 has a circumferential zone that is defined as a through hole local zone A.

Figure 5:
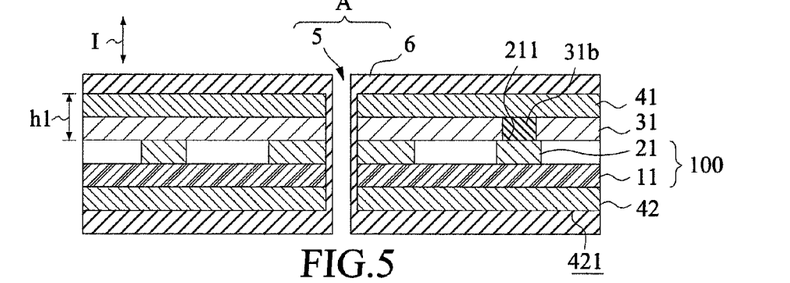
FIG. 5 is a cross-sectional view showing a conductive cover section is formed on a hole wall surface of the through hole, a top surface of the upper conductor layer, and a bottom surface of the lower conductor layer of FIG. 4.

As shown in FIG. 5, after the formation of the upper conductor layer 41, the lower conductor layer 42 and the through hole 5, a conductive cover section 6 covers an upper surface of the upper conductor layer 41, the lower conductor layer bottom surface 421 of the lower conductor layer 42, and the hole wall surface 51 of the through hole 5. The conductive cover section 6 may be formed with a sputtering or chemical copper process, and then with an electroplating process to form an electroplated copper layer. The conductive cover section 6 comprises a conductive material selected from copper, silver, gold or a combination thereof.

Figure 5A:
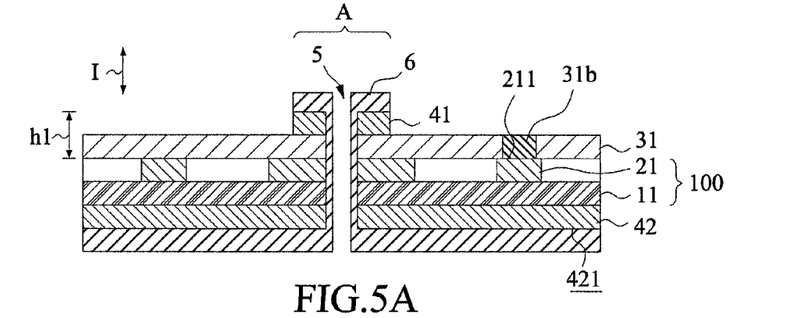
FIG. 5A is a cross-sectional view showing portions of the conductive cover section and the upper conductor layer that are outside the through hole of FIG. 5 are etched and removed.

As shown in FIG. 5A, after the formation of the conductive cover section 6, a portion of the conductive cover section 6 that is outside the through hole local zone A and a portion of the upper conductor layer 41 that is outside the through hole local zone A are removed through known etching techniques.

The upper conductor layer 41, the upper circuit trace 21, and the lower conductor layer 42 are electrically connected to each other through the conductive cover section 6.

Figure 6:
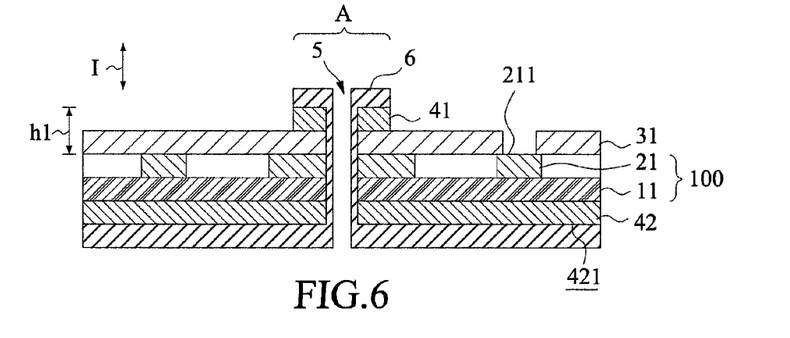
FIG. 6 is a cross-sectional view showing the etching resisting layer of FIG. 5A is removed.

As shown in FIG. 6, after the portion of the conductive cover section 6 formed on the upper conductor layer 41 and the portion of the upper conductor layer 41 that are outside the through hole local zone A are removed, the etching resisting layer 31b filled in the upper adhesive layer opening zone 31a is exposed. Under this condition, the etching resisting layer 31b can be removed to expose the upper circuit trace exposed zone 211 to serve as contact and conduction zones for surface-mounted devices or finger pad conductive contacts.

Referring to FIGS. 7-13, which are cross-sectional views showing a structure of via hole of electrical circuit board according to a second embodiment of the present invention at different steps of manufacture process, the carrier board according to the second embodiment of the present invention, generally designated at 200, is a double-sided board.

Figure 7:
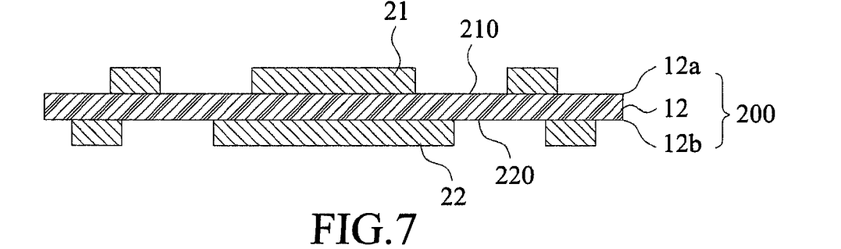
FIGS. 7-11 are cross-sectional views showing a carrier board according to a second embodiment of the present invention.

As shown in FIG. 7, a first double-sided board 12 has a double-sided board upper surface 12a and a double-sided board lower surface 12b, which respectively form at least one upper circuit trace 21 and at least one lower circuit trace 22. The upper circuit traces 21 are spaced by spacing zones 210 and the lower circuit traces 22 are spaced by spacing zones 220. The upper circuit trace 21 comprises at least one upper circuit trace exposed zone 211, and the lower circuit trace 22 selectively comprises at least one lower circuit trace exposed zone 221.

Figure 8:
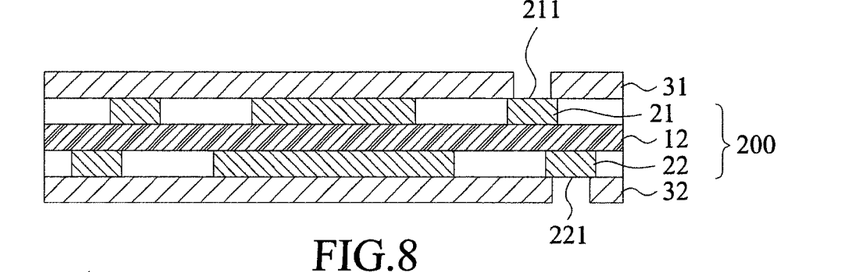
Figure 9:
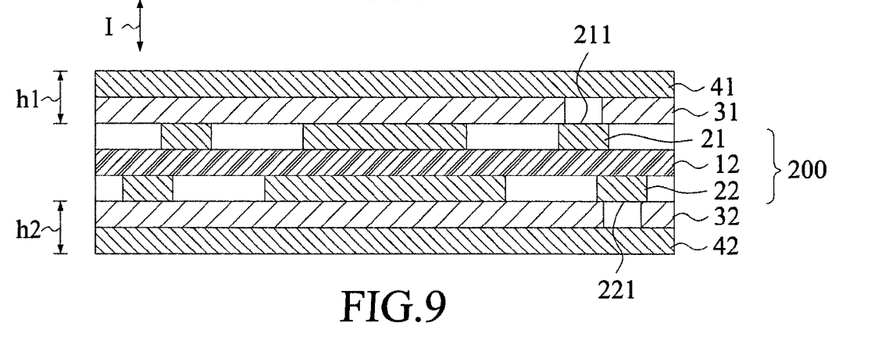

As shown in FIGS. 8 and 9, an upper adhesive layer 31 is formed on a surface of the upper circuit trace 21. A lower adhesive layer 32 is formed on a surface of the lower circuit trace 22. An upper conductor layer 41 is formed on a surface of the upper adhesive layer 31. The upper conductor layer 41 shows a first height difference h1 with respect to the upper circuit trace exposed zone 211 of the upper circuit trace 21 in a vertical direction I.

A lower conductor layer 42 is formed on a surface of the lower adhesive layer 32. The lower conductor layer 42 shows a second height difference h2 with respect to the lower circuit trace exposed zone 221 of the lower circuit trace 22 in the vertical direction I.

Figure 10:
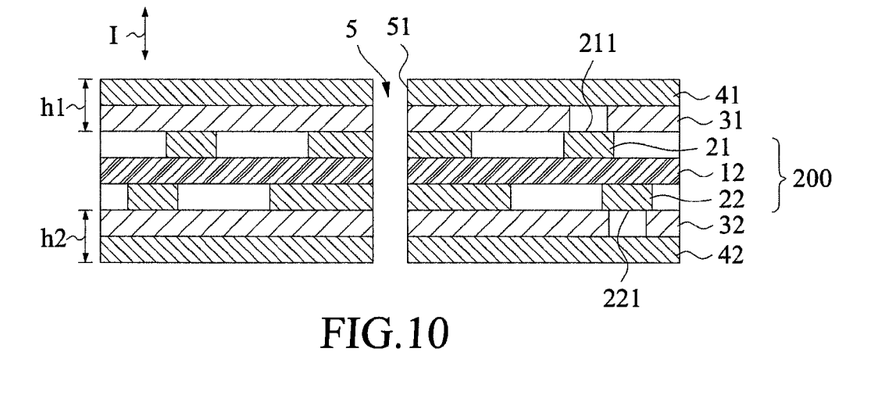

As shown in FIG. 10, at least one through hole 5 extends in the vertical direction I through the upper conductor layer 41, the upper adhesive layer 31, the upper circuit trace 21, the first double-sided board 12, the lower circuit trace 22, the lower adhesive layer 32, and the lower conductor layer 42, and forms a hole wall surface 51.

Figure 11:
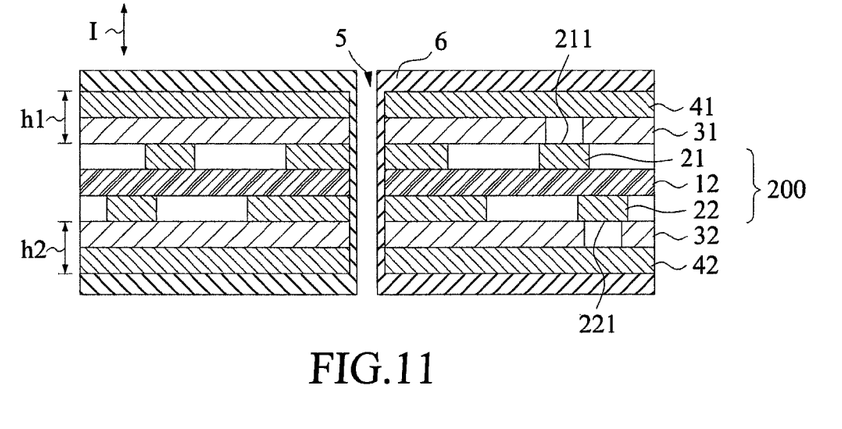

As shown in FIG. 11, a conductive cover section 6 covers an upper surface of the upper conductor layer 41, a lower surface of the lower conductor layer 42, and the hole wall surface 51 of the through hole 5.

Figure 12:
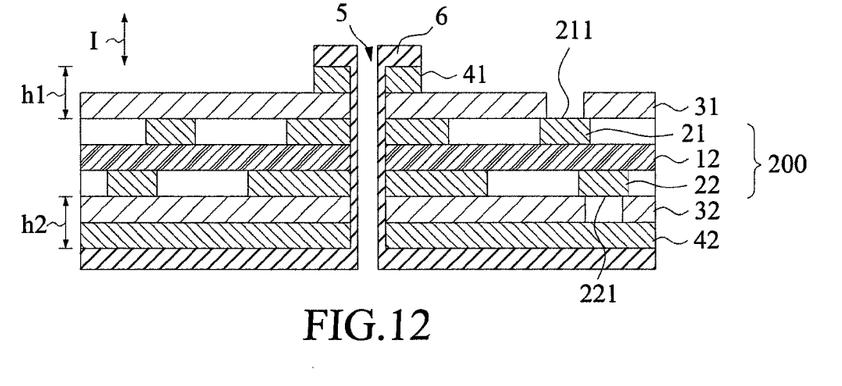
FIG. 12 is a cross-sectional view showing the second embodiment of the present invention after being completely assembled.

As shown in FIG. 12, the portion of the conductive cover section 6 that is other than that adjacent the through hole 5 and the portion of the upper conductor layer 41 that is other than that adjacent the through hole 5 are removed through known etching techniques or are partly preserved.

Figure 13:
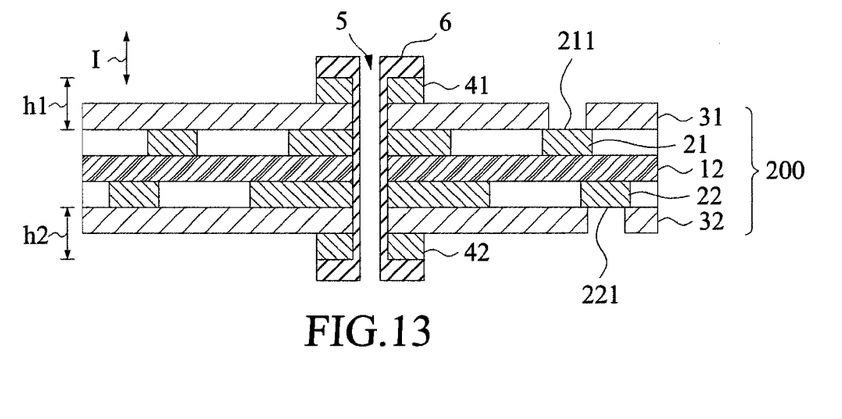
FIG. 13 is another cross-sectional view showing the second embodiment of the present invention after being completely assembled.

As shown in FIG. 13, the portion of the conductive cover section 6 that is other than that adjacent the through hole 5 and the portion of the lower conductor layer 42 that is other than that adjacent the through hole 5 are removed through known etching techniques or are partly preserved.

Figure 14:
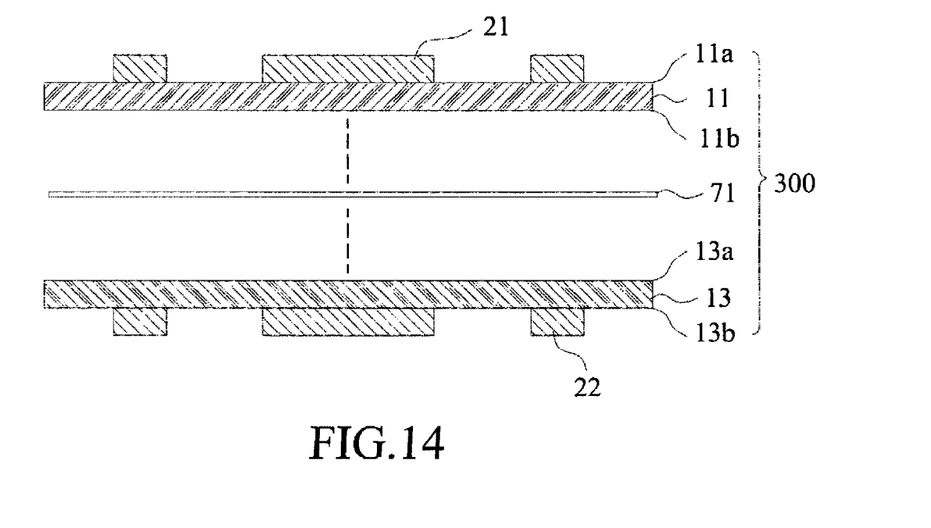
FIG. 14 is a cross-sectional view, in an exploded form, showing a carrier board according to a third embodiment of the present invention.

FIG. 14 is a cross-sectional view showing a carrier board according to a third embodiment of the present invention, generally designated at 300, which comprises two single-sided boards. As shown in the drawing, the carrier board comprises at least one first substrate 11, which has a first substrate upper surface 11a and a first substrate lower surface 11b, and at least one upper circuit trace 21 is formed on the first substrate upper surface 11a. At least one second substrate 13 has a second substrate upper surface 13a and a second substrate lower surface 13b, and the second substrate upper surface 13a is bonded by a bonding layer 71 to the first substrate lower surface 11b of the first substrate 11. At least one lower circuit trace 22 is formed on the second substrate lower surface 13b. The bonding layer 71 shows material properties of adhesion and insulation. The carrier board 300 of the third embodiment can replace the carrier board 100 of the first embodiment and the manufacture process illustrated in FIGS. 2-6 is applicable to the carrier board of the third embodiment to form a structure of electrical circuit board via hole that is composed of two single-sided boards.

Figure 15:
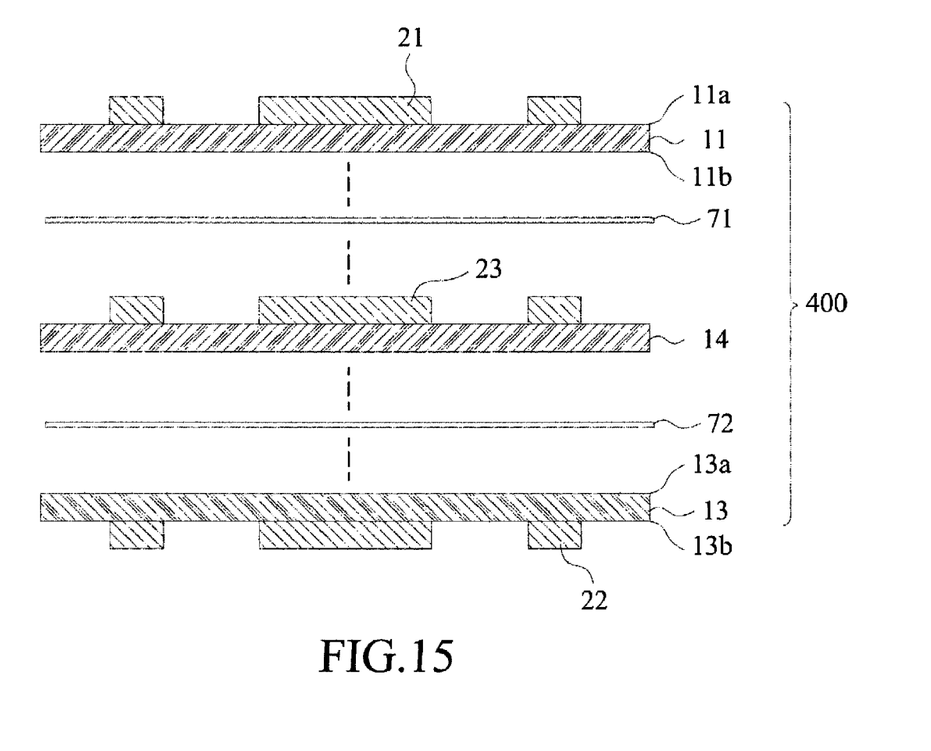
FIG. 15 is a cross-sectional view, in an exploded form, showing a carrier board according to a fourth embodiment of the present invention.

FIG. 15 is a cross-sectional view showing a carrier board according to a fourth embodiment of the present invention, generally designated at 400, which comprises three single-sided boards. The general structure of the fourth embodiment is similar to that of FIG. 14, but at least one third substrate 14 and bonding layers 71, 72 are arranged between the second substrate upper surface 13a of the second substrate 13 and the first substrate lower surface 11b of the first substrate 11. The third substrate 14 has a surface on which at least one intermediate circuit trace 23 is formed.

Figure 16:
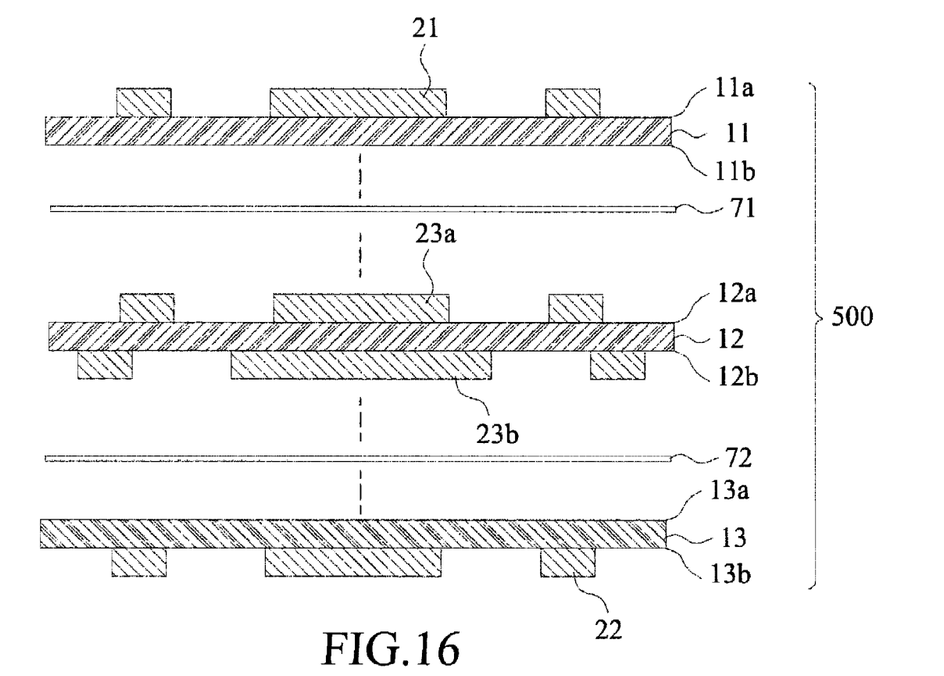
FIG. 16 is a cross-sectional view, in an exploded form, showing a carrier board according to a fifth embodiment of the present invention.

FIG. 16 is a cross-sectional view showing a carrier board according to a fifth embodiment of the present invention, generally designated at 500, which comprises two single-sided boards and one double-sided board. The carrier board of the fifth embodiment comprises a first substrate 11, which has a first substrate upper surface 11a and a first substrate lower surface 11b, and at least one upper circuit trace 21 is formed on the first substrate upper surface 11a. A second substrate 13 has a second substrate upper surface 13a and a second substrate lower surface 13b, and at least one lower circuit trace 22 is formed on the second substrate lower surface 13b.

At least one first double-sided board 12 is arranged between the second substrate upper surface 13a of the second substrate 13 and the first substrate lower surface 11b of the first substrate 11. The first double-sided board 12 has a double-sided board upper surface 12a and a double-sided board lower surface 12b, each of which forms at least one intermediate circuit trace 23a, 23b. The double-sided board upper surface 12a is bonded by a bonding layer 71 to the first substrate lower surface 11b of the first substrate 11 and the double-sided board lower surface 12b is bonded by a bonding layer 72 to the second substrate upper surface 13a of the second substrate 13.

Figure 17:
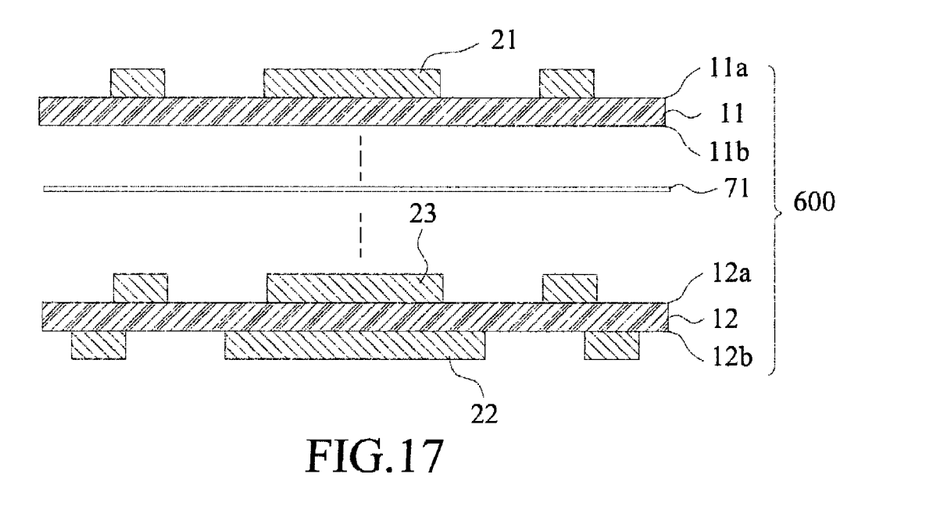
FIG. 17 is a cross-sectional view, in an exploded form, showing a carrier board according to a sixth embodiment of the present invention.

FIG. 17 is cross-sectional view showing a carrier board according to a sixth embodiment of the present invention, generally designated at 600, which comprises one single-sided board and one double-sided board. The carrier board of the sixth embodiment comprises a first substrate 11, which has a first substrate upper surface 11a and a first substrate lower surface 11b, and at least one upper circuit trace 21 is formed on the first substrate upper surface 11a. At least one first double-sided board 12 has a double-sided board upper surface 12a and a double-sided board lower surface 12b. The double-sided board upper surface 12a is bonded by a bonding layer 71 to the first substrate lower surface 11b of the first substrate 11. At least one lower circuit trace 22 is formed on the double-sided board lower surface 12b. At least one intermediate circuit trace 23 is formed on the double-sided board upper surface 12a of the first double-sided board 12.

Figure 18:
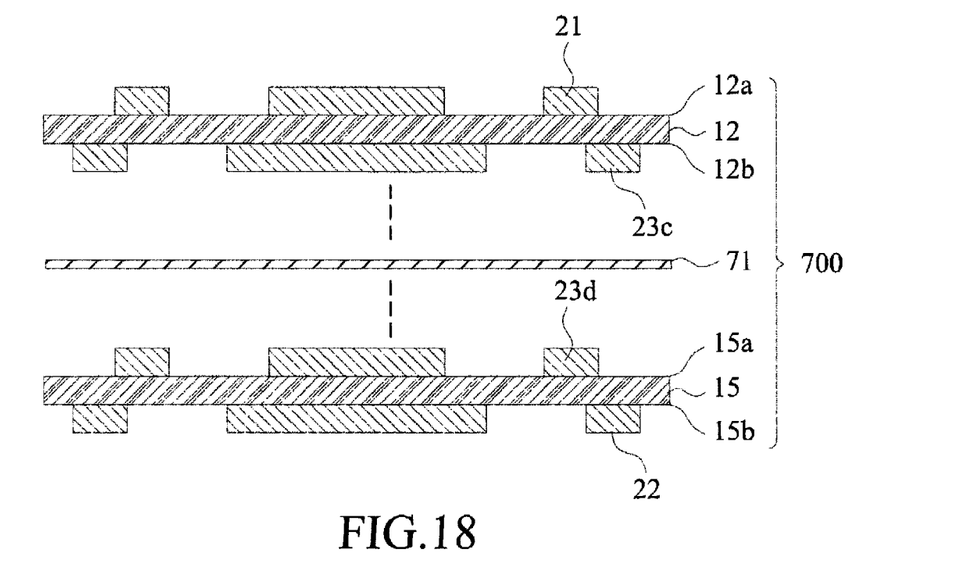
FIG. 18 is a cross-sectional view, in an exploded form, showing a carrier board according to a seventh embodiment of the present invention.
Figure 19:
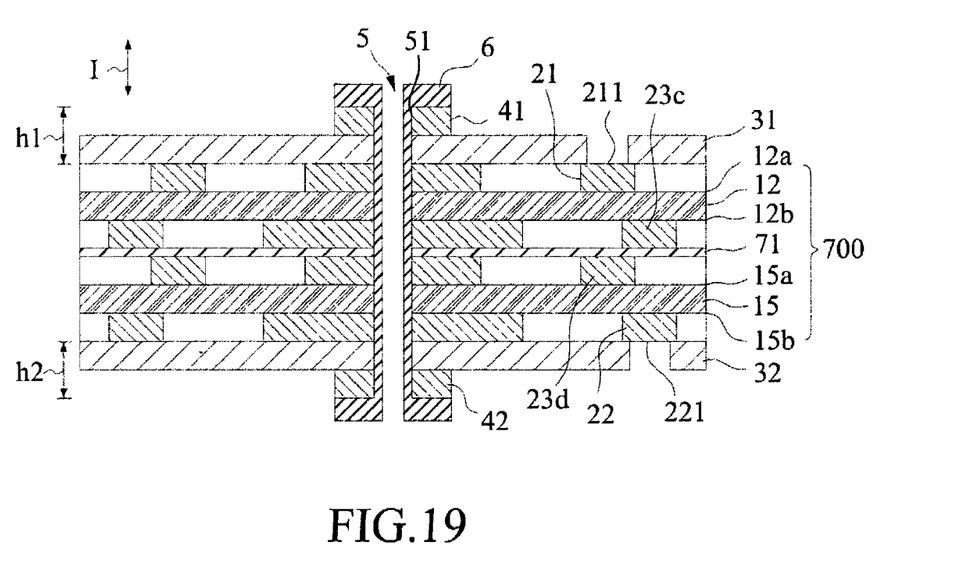
FIG. 19 is a cross-sectional view showing the seventh embodiment of the present invention after being completely assembled.

FIG. 18 is a cross-sectional view showing a carrier board according to a seventh embodiment of the present invention, generally designated at 700, which comprises two double-sided boards and FIG. 19 is a cross-sectional view showing the seventh embodiment after being completely assembled. The carrier board 700 comprises a first double-sided board 12, which has a double-sided board upper surface 12a and a double-sided board lower surface 12b, and at least one upper circuit trace 21 is formed on the double-sided board upper surface 12a. At least one second double-sided board 15 has a double-sided board upper surface 15a and a double-sided board lower surface 15b. The double-sided board upper surface 15a is bonded by a bonding layer 71 to the double-sided board lower surface 12b of the first double-sided board 12. At least one lower circuit trace 22 is formed on the double-sided board lower surface 15b of the second double-sided board 15. At least one first double-sided board intermediate circuit trace 23c is formed on the double-sided board lower surface 12b of the first double-sided board 12. At least one second double-sided board intermediate circuit trace 23d is formed on the double-sided board upper surface 15a of the second double-sided board 15.

Referring to FIG. 19, after the assembling, an upper adhesive layer 31 is formed on at least a partial area of the upper circuit trace 21 of the first double-sided board 12 and the portion of the upper circuit trace 21 that is not covered by the upper adhesive layer 31 is defined as an upper circuit trace exposed zone 211. An upper conductor layer 41 is formed on an upper surface of the upper adhesive layer 31. The upper conductor layer 41 shows a first height difference h1 with respect to the upper circuit trace exposed zone 211 in a vertical direction I.

A lower adhesive layer 32 is formed on at least a partial area of the lower circuit trace 22 of the second double-sided board 15 and the portion of the lower circuit trace 22 that is no covered by the lower adhesive layer 32 is defined as a lower circuit trace exposed zone 221. A lower conductor layer 42 is formed on a lower surface of the lower adhesive layer 32. The lower conductor layer 42 shows a second height difference h2 with respect to the lower circuit trace exposed zone 221 in the vertical direction I.

At least one through hole 5 extends in the vertical direction I through the upper conductor layer 41, the upper adhesive layer 31, the upper circuit trace 21, the first double-sided board 12, the first double-sided board intermediate circuit trace 23c, the bonding layer 71, the second double-sided board intermediate circuit trace 23d, the second double-sided board 15, the lower circuit trace 22, the lower adhesive layer 32, and the lower conductor layer 42, and forms a hole wall surface 51. A conductive cover section 6 covers the hole wall surface 51 of the through hole 5, a partial area of the upper conductor layer 41 of the first double-sided board 12 that is adjacent to the through hole 5, and a partial area of the lower conductor layer 42 of the second double-sided board 15 that is adjacent to the through hole 5.

In a practical application, the through hole 5 can be selectively and electrically connected to the upper circuit trace 21, the lower circuit trace 22, the first double-sided board intermediate circuit trace 23c, the second double-sided board intermediate circuit trace 23d, as desired.

Figure 20:
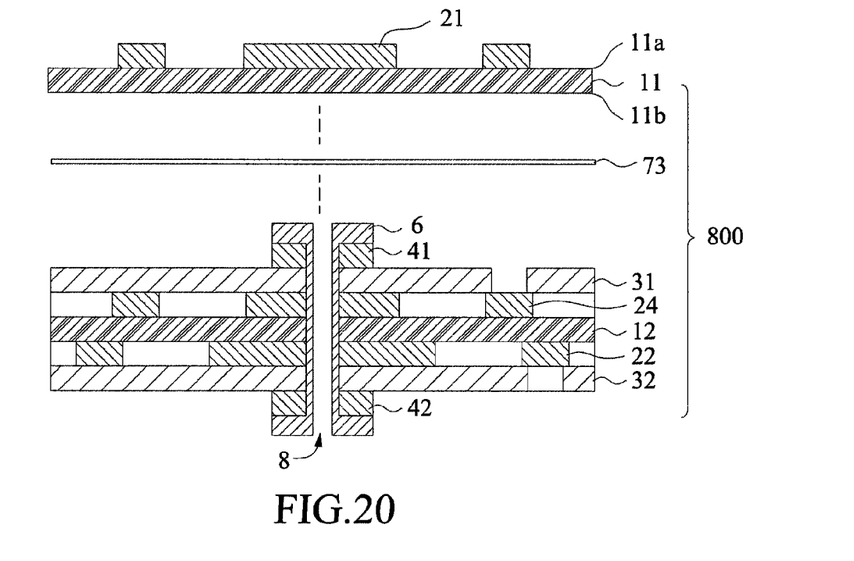
FIG. 20 is a cross-sectional view, in an exploded form, showing a carrier board according to an eighth embodiment of the present invention.

FIG. 20 is cross-sectional view showing a carrier board according to an eighth embodiment of the present invention, generally designated at 800, which comprises one single-sided board and one double-sided board. As shown in the drawing, the carrier board of the eighth embodiment comprises at least one first substrate 11 and one first double-sided board 12. The first double-sided board 12 comprises a buried hole 8. The buried hole 8 has a structure similar to the structure of the through hole 5 shown in FIG. 13, but the buried hole 8 is pre-formed before the first substrate 11 and the first double-sided board 12 are bonded. The first double-sided board 12 has an upper surface forming an upper circuit trace that serves as an intermediate circuit trace 24. The first double-sided board 12 has a lower surface forming at least one lower circuit trace 22. The first substrate 11 has an upper surface 11a forming at least one upper circuit trace 21. The first double-sided board 12 and the first substrate 11 are bonded to each other by a bonding layer 73.

After the first substrate 11 and the first double-sided board 12 are bonded together by the bonding layer 73, a manufacture process as what descried above is performed, for making a through hole, at a location shifted from the buried hole 8. This completes a structure of three-layered electrical circuit board comprising a buried hole and an intermediate circuit trace layer to serve as the carrier board according to the present invention.

In the instant embodiment, a single-sided board is bonded by a bonding layer 73 to a double-sided board in which a buried hole 8 is formed in advance to form a carrier board 800. The carrier board 800 may then replace the carrier board 100 of the first embodiment to subject to the manufacture process illustrated in FIGS. 2-6 at a location that is shifted from the buried hole 8 of the first double-sided board 12. This completes a structure of via hole of electrical circuit board that comprises a buried hole and an intermediate circuit trace layer.

Figure 21:
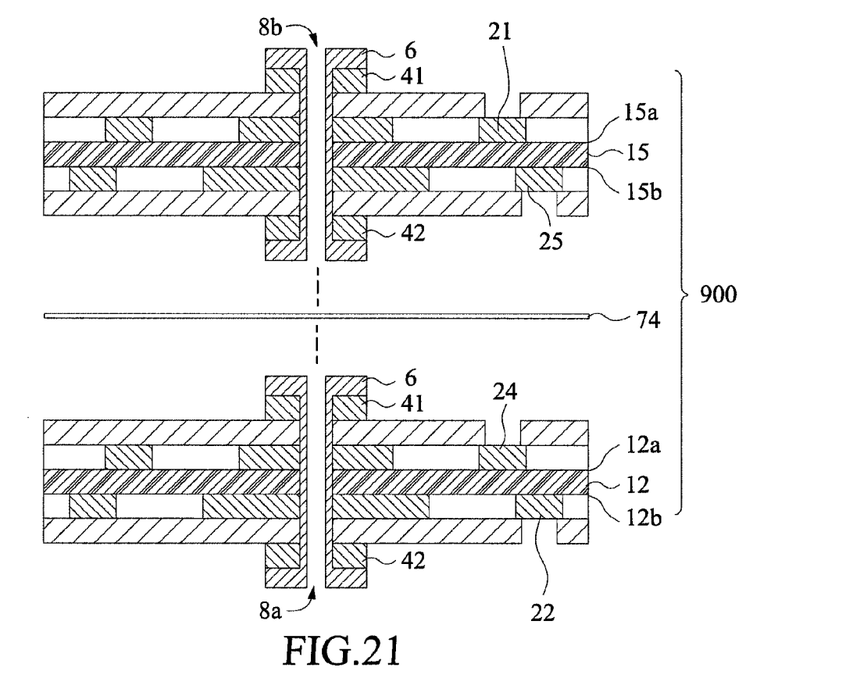
FIG. 21 is a cross-sectional view, in an exploded form, showing a carrier board according to a ninth embodiment of the present invention.

FIG. 21 is a cross-sectional view showing a carrier board according to a ninth embodiment of the present invention, generally designated at 900, which comprises two double-sided boards. As shown in the drawing, the carrier board of the ninth embodiment comprises at least two double-sided boards 12, 15, and the two double-sided boards each form a buried hole 8a, 8b in advance. The first double-sided board 12 has a double-sided board upper surface 12a that forms at least one intermediate circuit trace 24. The double-sided board has a double-sided board lower surface 12b that forms at least one lower circuit trace 22. The second double-sided board 15 has a double-sided board lower surface 15b that forms at least one intermediate circuit trace 25 and a double-sided board upper surface 15a that forms at least one upper circuit trace 21. The two double-sided boards 12, 15 are bonded to each other by a bonding layer 74.

After the two double-sided boards 12, 15 are bonded together by the bonding layer 74, the manufacture process for through hole discussed above can then be carried out in order to complete a structure of four-layered electrical circuit board that has buried holes and intermediate circuit trace layers to serve as a carrier board of the present invention. In the instant embodiment, two double-sided boards 12, 15 that form buried holes in advance are bonded together by a bonding layer 74 to form a carrier board 900, and then, the carrier board 900 may replace the carrier board 100 of the first embodiment to subject to the manufacture process illustrated in FIGS. 2-6 by avoiding the locations of the buried holes so as to complete a structure of via hole of electrical circuit board that comprise buried holes and intermediate circuit trace layers.

Figure 22:
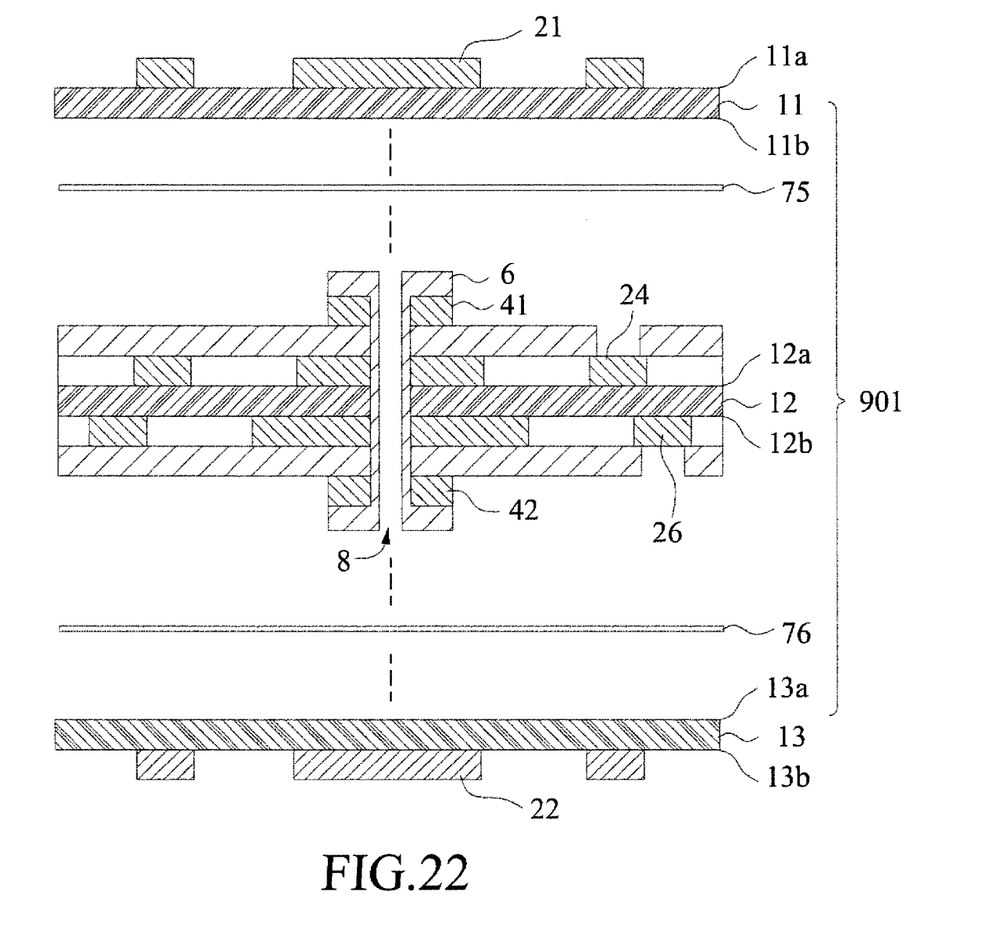
FIG. 22 is a cross-sectional view, in an exploded form, showing a carrier board according to a tenth embodiment of the present invention.

FIG. 22 is cross-sectional view showing a carrier board according to a tenth embodiment of the present invention, generally designated at 901, which comprises one double-sided board and two single-sided boards. As shown in the drawing, the carrier board of the tenth embodiment comprises at least one first double-sided board 12, which comprise a pre-formed buried hole 8. The first double-sided board 12 has a double-sided board upper surface 12a and a double-sided board lower surface 12b, which respectively form at least one intermediate circuit trace 24, 26 and are respectively bonded by bonding layers 75, 76 to a first substrate 11 and a second substrate 13. The first substrate 11 and the second substrate 13 are both single-sided boards. The first substrate 11 has an upper surface 11a forming at least one upper circuit trace 21, and the second substrate 13 has a lower surface 13b forming at least one lower circuit trace 22.

After the first double-sided board 12 and the first and second substrates 11, 13 are bonded to each other by the bonding layers 75, 76, the manufacture process illustrated in FIGS. 2-6 is performed at a location avoiding the buried hole 8 of the first double-sided board 12 in order to complete a structure of four-layered electrical circuit board comprising a buried hole and intermediate circuit trace layers to serve as the carrier board according to the present invention.

It is appreciated from the above embodiments that the present invention combines one or more single-sided boards and double-sided boards or multi-layered boards to form various structures of carrier board, wherein the single-sided boards, the double-sided boards, and the multi-layered boards can be circuit boards of different properties, such as flexible circuit boards, rigid circuit boards, and composite boards of flexible and rigid boards. And, various embodiments can be made by combining the structure of via hole and the manufacture process according to the present invention.

Although the present invention has been described with reference to the preferred embodiments thereof, it is apparent to those skilled in the art that a variety of modifications and changes may be made without departing from the scope of the present invention which is intended to be defined by the appended claims.

What is claimed is:
1. An electrical circuit board, comprising: a carrier board, which is a flexible circuit board, the carrier board including a first substrate, which has a substrate upper surface and a substrate lower surface, the substrate upper surface including at least one upper circuit trace; an upper adhesive layer, which is formed on at least a partial area of the upper circuit trace, an upper adhesive layer opening zone is formed in a portion of the upper adhesive layer thus forming an upper circuit trace exposed zone; an etching resisting layer, which is filled in the upper adhesive layer opening zone; an upper conductor layer, which is formed on the upper adhesive layer and the etching resisting layer, the upper conductor layer showing a first height difference with respect to the upper circuit trace exposed zone in a vertical direction; a lower adhesive layer, which is formed on at least a partial area of the lower circuit trace, a portion of the lower circuit trace that is not covered by the lower adhesive layer forming a lower circuit trace exposed zone, the lower adhesive layer including a lower adhesive layer opening zone corresponding to the lower circuit trace exposed zone; a lower conductor layer, which is formed on the substrate lower surface of the carrier board, the lower conductor layer having a lower conductor layer bottom surface; at least one through hole, which extends in the vertical direction through the upper conductor layer, the upper adhesive layer, the upper circuit trace, the first substrate, and the lower conductor layer and forms a hole wall surface, the through hole having a circumferential zone defining a through hole local zone; and a conductive cover section, which covers the hole wall surface of the through hole, a portion of the upper conductor layer top surface of the upper conductor layer in the through hole local zone, and the lower conductor layer bottom surface of the lower conductor layer, a portion of the conductive cover section that is outside the through hole local zone, and a portion of the upper conductor layer that is outside the through hole local zone being removed.

* * * * *